United States Patent
Handley

(10) Patent No.: US 6,751,359 B1
(45) Date of Patent: Jun. 15, 2004

(54) METHOD TO PROGRAM BIT VECTORS FOR AN INCREASING NONLINEAR FILTER

(75) Inventor: John C. Handley, Fairport, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/559,476

(22) Filed: Apr. 27, 2000

(51) Int. Cl.$^7$ ................................................ G06K 9/40
(52) U.S. Cl. ........................ 382/260; 708/319; 708/551
(58) Field of Search ................................. 382/252, 260; 708/191, 205, 209, 234, 497, 552, 710, 821; 712/16, 202, 233, 211, 221, 245

(56) References Cited

U.S. PATENT DOCUMENTS

| | | | | |
|---|---|---|---|---|
| 3,679,977 A | * | 7/1972 | Howson ..................... | 375/290 |
| 4,589,084 A | * | 5/1986 | Fling et al. ................. | 708/551 |
| 4,661,948 A | * | 4/1987 | Shapiro et al. ............. | 370/295 |
| 4,771,396 A | * | 9/1988 | South et al. ................ | 708/319 |
| 4,941,191 A | * | 7/1990 | Miller et al. ................ | 382/261 |
| 6,071,004 A | * | 6/2000 | Le Gall et al. .............. | 712/22 |
| 6,173,388 B1 | * | 1/2001 | Abercrombie et al. ........ | 712/22 |

* cited by examiner

Primary Examiner—Jayanti K. Patel
Assistant Examiner—Abolfazl Tabatabai
(74) Attorney, Agent, or Firm—Philip E. Blair

(57) ABSTRACT

An increasing nonlinear-filter represented as a plurality of basis elements along with the filter values at those basis elements by finding, for each output value k of the filter, all possible observations X that result in an output value k or greater. The set of all values that map to an output value k or greater have at least one minimal element at these are known in the art as basis elements. These basis elements are arranged in a list, numbered 1 through M. Constructing a table in which basis element number corresponds to the filter output value at that basis element. Thereafter, each of the N samples $(X_1, \ldots, X_N)$ is inspected in turn. For each sample $X_1$, testing each of its possible values with its respective interval components wherein, if the M basis elements are $A_1, \ldots, A_M$ and if basis element number j is being inspected, then each value of $X_1$ is tested against $A_{ij}$. For each value of $X_1 = t_1, \ldots, t_G$, put an entry '1' in table BV[j][k][m] if $t_k$ is greater than or equal to $A_{ij}$ and put an entry '0' in a table BV[j][k][m], otherwise. A table linking bit vector positions to filter output values is thereafter generated by computing filter values at each basis element. The list is sorting in increasing order. The position of the sorted output values corresponds to bit vector positions. For example, position 0 corresponds to the least filter value for a basis element and position M−1 corresponds to the greatest filter value for a basis element. In such a manner, the output values of filter of the present invention are readily obtainable by a small deterministic sequence of table lookups and a set of bit-wise logical operations.

2 Claims, 4 Drawing Sheets

METHOD TO PROGRAM BIT VECTORS FOR AN INCREASING NONLINEAR FILTER

REFERENCE TO COPENDING APPLICATIONS

Attention is directed to commonly owned and assigned copending Application Numbers:

U.S. Ser. No. 09/561,609, filed Apr. 27, 2000 entitled "METHOD FOR GENERATING SHIFT-INVARIANT FILTERS".

U.S. Ser. No. 09/561,608, filed Apr. 27, 2000 entitled "A METHOD TO PROGRAM A NONLINEAR FILTER".

U.S. Ser. No. 09/559,506, filed Apr. 27, 2000 entitled "A METHOD FOR GENERATING INCREASING SHIFT-INVARIANT FILTERS".

The disclosure of the above mentioned copending applications are incorporated herein by reference in their entirety.

FIELD OF THE INVENTION

The present invention is generally related to the field of signal processing and, more particularly, to the field of programmable hardware and/or software filtering systems and methods of image data in compact, efficient computing architectures.

BACKGROUND OF THE INVENTION

In the arts it is often necessary to manipulate a received signal or image, for both practical and operational reasons. For instance, the signal may need to be enhanced prior to some secondary operation being performed on the data such as printing with a laser printer. A scanned image may eventually need to be restored or reconstructed to its original form. Other operations can take the form of resolution conversion, thinning or thickening, among others. In order to manipulate the received signal or image data in these instances, mathematical operations are often performed. To achieve this, the discrete signal or image is often converted into or represented by a mathematical sequence or array of discrete values. For example, binary signals or images often take the form of discrete values of [0,1] and 8-bit gray-scale images often take the form of values in the range of [0 255]. The field of discrete signal and image processing, both theoretical and applied, is relatively dominated by mathematics in the form of specific methods and applications.

Many methods of signal or image processing use one or more applications involving filters. A filter operates by capturing a windowed observation of an image or signal. A windowed observation is a collection or vector of samples from the captured image or signal. Based on this vector, a decision, based on some formula or algorithm, is made about the image or signal at a particular position within the image or signal. In general, a filter operates on a set of signal or image samples which are mathematically written as a vector having the form of $(X_1, \ldots, X_N)$.

Many techniques can be found in the arts, of which the following are representative and which are hereby incorporated by reference being made thereto. For example, a filter can assign a new sample value to the center pixel of a window in order to accomplish the overall goal of a restoration or enhancement of a degraded image, as taught by *Enhancement and Restoration of Digital Documents*, R. P. Loce and E. R. Dougherty, SPIE Press, 1997, and *Enhancement of Digital Documents*, R. P. Loce and E. R. Dougherty, Electronic Imaging Technology, SPIE Press 1999, and *Two-Dimensional Signal and Image Processing*, J. S. Lim, Prentice Hall, 1990. Many other operations are found in the known literature. Furthermore, other applications of filters used in signal or image processing include, resolution conversion, object detection, speckle-removal, and edge enhancement.

Nonlinear image or signal processing is a general representation of signal or image filtering based on a logical decomposition of a filter into a set of relatively simple operators. Any windowed increasing shift-invariant filter can be represented as a combination of simple operations called erosions as taught by *Nonlinear Filters for Image Processing*, E. R. Dougherty and J. Astola (eds.), SPIE/IEEE Press, 1999. The term nonlinear refers to the entire class of windowed filters that includes linear filters, i.e., those filters computed by convolution.

Since filters can be highly complex and repeatedly be executed millions of times in rapid succession in order to perform a single operation on a given image or signal, what is needed in the arts are compact, efficient computing architectures directed towards this end. Efficient architectures depend on filter representations. If a filter can be broken down into its base operations, it might be possible to execute the relatively simple operations in parallel in order to achieve high-speed execution and overall efficiency.

*Computational Gray-Scale Morphology on Lattices (A Comparator-Based Image Algebra) Part I: Architecture*, E. R. Dougherty and D. Sinha, Real Time Imaging, Vol.1, No.1, 1995, teaches a computer architecture using representations that perform tests in parallel. The representational methods as taught therein express any filtering operation as a collection of logical tests or operations wherein each logical test is associated with a value. If a windowed observation satisfies a test, the filter output is then associated with that value. Although the above architecture is not practical for filters requiring many tests, it does teach general representational method.

Increasing filters are of special interest in the art of signal processing because they can be more efficiently implemented. An increasing filter F has the mathematical property that if $(x_1, \ldots, x_N) <= (y_1, \ldots, y_N)$, then $F(x_1, \ldots, x_N) <= F(y_1, \ldots, y_N)$. It is known in the art that increasing filters can have two orders of magnitude fewer logical comparisons in their representations that a general non-increasing filter. Applications of increasing filters known in the art are thinning, thickening, hole-filling, restoration of ragged edges, resolution conversion, median filtering, and noise removal.

It is the aim of the present invention to overcome the conventional prior art print limitations, as described above, by programming a computational architecture to perform logical comparisons in a more compact and efficient way.

BRIEF SUMMARY OF THE INVENTION

An increasing nonlinear-filter represented as a plurality of basis elements along with the filter values at those basis elements by finding, for each output value k of the filter, all possible observations X that result in an output value k or greater. The set of all values that map to an output value k or greater have at least one minimal element at these are known in the art as basis elements. These basis elements are arranged in a list, numbered 1 through M. Constructing a table in which basis element number corresponds to the filter output value at that basis element. Thereafter, each of the N samples $(X_1, \ldots, X_N)$ is inspected in turn. For each sample $X_i$, testing each of its possible values with its respective interval components wherein, if the M basis elements are $A_1, \ldots, A_M$ and if basis element number 1 is being inspected, then each value of $X_1$ is tested against $A_{ij}$. For each value of $X_i=t_1, \ldots, t_G$, put an entry '1' in table BV[j][k][m] if $t_k$ is greater than or equal to $A_{ij}$ and put an entry '0' in a table BV[j][k][m], otherwise. A table linking bit vector positions to filter output values is thereafter generated by computing filter values at each basis element. The list is sorting in increasing order. The position of the sorted output values corresponds to bit vector positions. For example, position 0 corresponds to the least filter value for a basis element and position M−1 corresponds to the greatest filter value for a basis element. In such a manner, the output values of filter of the present invention are readily obtainable by a small deterministic sequence of table lookups and a set of bit-wise logical operations.

DETAILED DESCRIPTION OF THE INVENTION

A filter, whether operating on binary, gray-scale or other multilevel signals, can be mathematically represented as a set of simple tests against a set of basis elements or vectors. This mathematical fact is developed in *Computational Gray-Scale Morphology on Lattices* (*A Comparator-Based Image Algebra*) *Part I: Architecture*, E. R. Dougherty and D. Sinha, Real Time Imaging, Vol.1, No.1, 1995, which is incorporated herein by reference. To briefly explain, a filter is represented mathematically as a function which maps a vector X to an output value a. For example, for an 8-bit signal, value of a can be 0, 1, . . . , 255. Call S[a] the set of all vectors X which map to a and values greater that a. Each output value a of the filter has a set S[a]. Every possible signal sample X belongs to at least one S[a]. Each set S[a] has at least one minimal element. The set of all minimal elements is called a basis for the filter. Evaluating the filter at X is equivalent to determining the largest basis element which is less than or equal to X and then reporting the filter value at that basis element.

It should be understood that one skilled in this art should have a solid background in higher mathematics specifically in the fields of nonlinear signal or image processing, and be readily familiar with the concepts of binary operations, basic filtering concepts and operations, and computer architecture.

Figure 1:
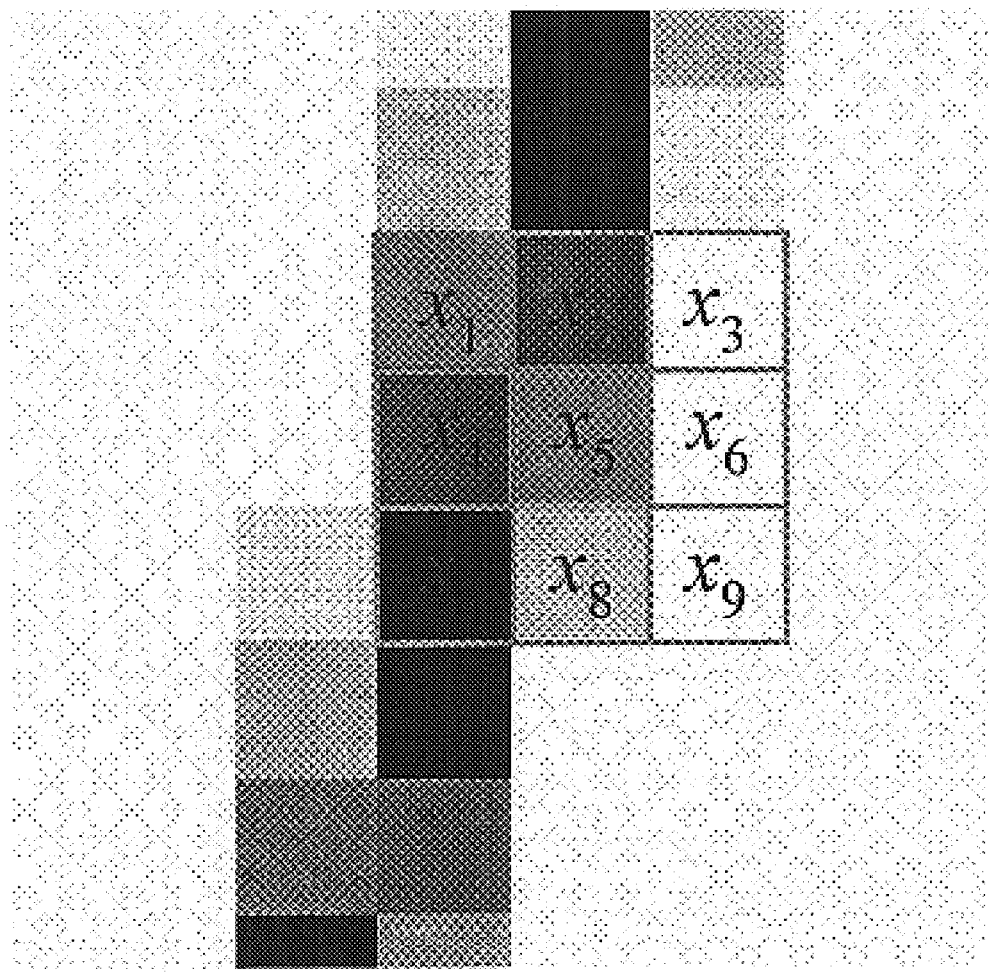
FIG. 1 is an illustration of a segment of a window capture where each pixel or sample is represented by vector notation wherein, based on a windowed observation ($x_1$, $x_2$, $x_3$, $x_4$, $x_5$, $x_6$, $x_7$, $x_8$, $x_9$), modify or tag the center pixel.
Figure 2:
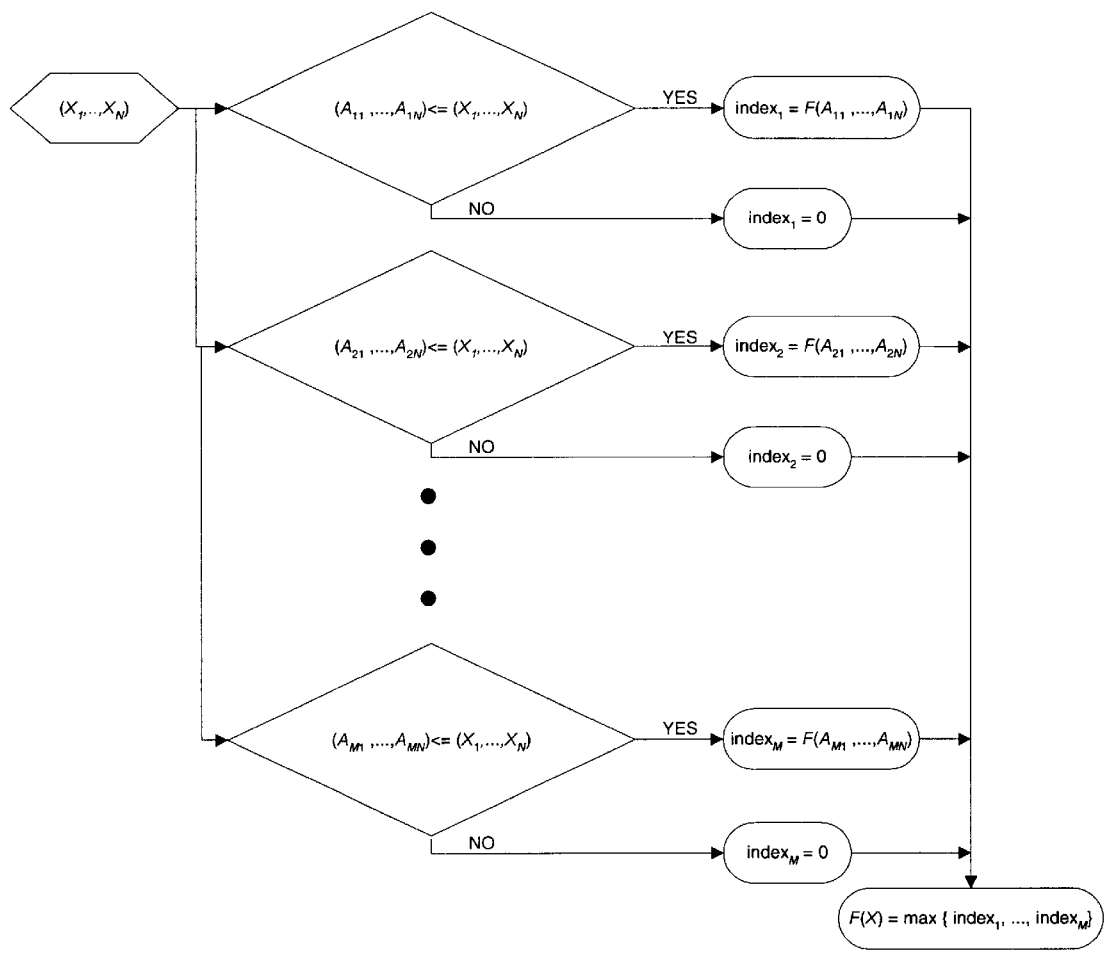
FIG. 2 illustrates a filter represented as a sequence of logical tests followed by a table look up.

With reference being made to the first step of the present invention, increasing non-linear filters can be represented as a set or sequence of logical tests as to which basis elements are less than or equal to a windowed observation. For example, FIG. 1 illustrates a windowed observation of a captured gray-scale image wherein nine samples or pixels are represented by vector notation. From these nine samples of captured pixels, a filter would be employed to make one or more decisions or observations with respect to the entire captured gray scale image. Given an observation with N samples, as represented by $X=(X_1, \ldots, X_N)$, and the desire to test whether X is greater than or equal to a basis element given by $A=(A_1, \ldots, A_N) \leq X$, wherein component-wise: $A_i \leq X_i$ for each i=1, . . . , N, a filter can be employed to represent a list of the basis elements A, each having its associated output value. Once it is determined to which basis elements an observation is greater-than-or-equal-to, the output value of the filter can be determined from the maximum basis element. This representation is illustrated in FIG. 2.

Step one is to represent an increasing nonlinear-filter as a plurality of basis elements along with the filter values at those basis elements. This involves finding, for each output value k of the filter, all possible observations X that result In an output value k or greater. The set of all values that map to an output value k or greater have at least one minimal element at these are known in the art as basis elements. These basis elements are arranged in a list, numbered 1 through M. Next a further table is constructed in which basis element number corresponds to the filter output value at that basis element. This step concludes filter representation.

Figure 3:
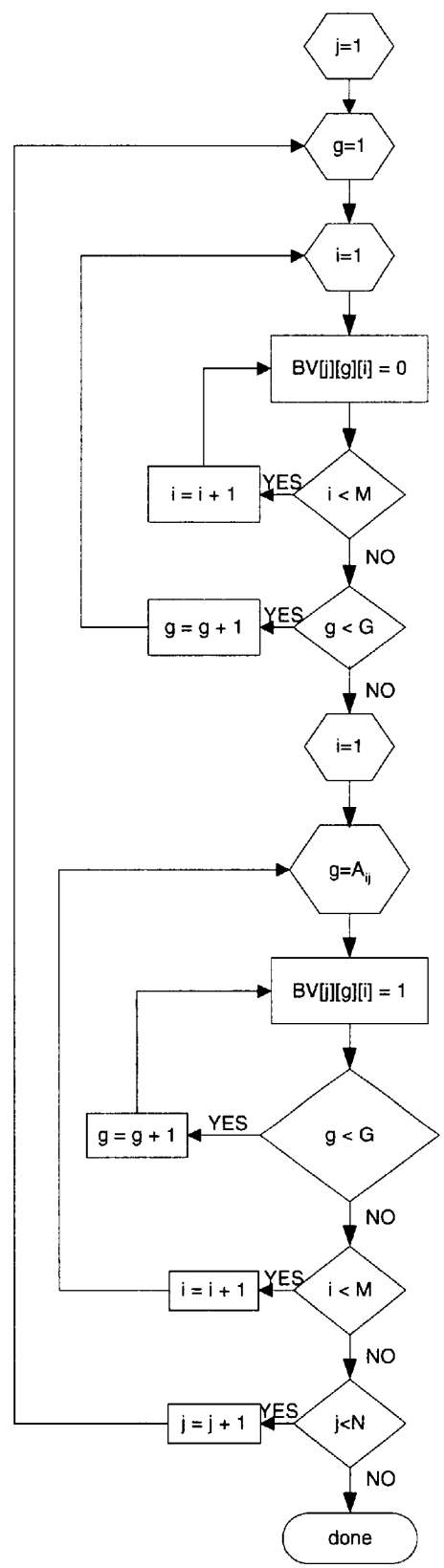
FIG. 3 is a flowchart of the programming process for the bit vector tables in a non-linear filter computational architecture.

Each of the N samples ($X_1, \ldots, X_N$) is inspected in turn. For each sample $X_i$, each of its possible values are tested with its respective interval components. Specifically, if the M basis elements are $A_1, \ldots, A_M$ and if basis element number j is being inspected, then each value of $X_i$ is tested against $A_{ij}$. For each value of $X_i=t_1, \ldots, t_G$, put an entry '1' in table BV[j][k][m] if $t_k$ is greater than or equal to $A_{ij}$ and put an entry '0' in a table BV[j][k][m], otherwise. This step in illustrated in FIG. 3.

Figure 4:
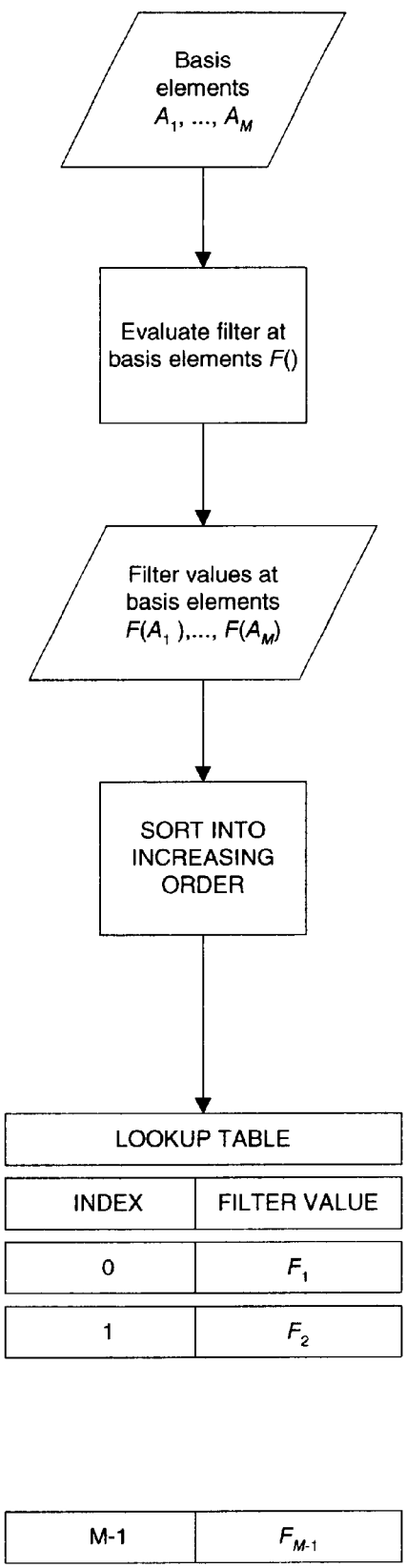
FIG. 4 is a flowchart showing how to construct the lookup table that maps bit vector positions into filter values.

The last step is to construct a table linking bit vector positions to filter output values. The Table is constructed by computing filter values at each basis element and sorting this list in increasing order. The position of the sorted output values correspond to bit vector positions. This step is shown in FIG. 4. For example, position 0 corresponds to the least filter value for a basis element and position M−1 corresponds to the greatest filter value for a basis element.

This invention also programs data for filters on binary signals. Tables of bit vectors can be constructed in the binary domain. It is known in the art that any windowed increasing shift-invariant binary filter can be represented as a union or logically OR'ing a set of erosions. It is also known in the art that these erosion operations can be represented as testing whether or not a vector is greater than or equal to a basis element as illustrated in FIG. 2 as in the multiple-bit-per sample cases above.

Windowed increasing shift-invariant filters represent a plethora of operations including but not limited to processing sampled digital electrical signals such as used in sensors, sound reproduction, servo-mechanical control, audio data compression, ultrasound, and so on. In two dimensions, windowed shift-invariant filters are used to process image data in medical imaging, remote sensing, machine vision and inspection, document processing, synthetic aperture radar, military target recognition, and so on. Examples are object detection, image enhancement, data compression, thresholding, noise-removal, image reconstruction, resolution conversion, and various data manipulations to prepare images for printing or display. Samples may also be obtained from higher-dimensional data such as voxels in a digital three dimensional representation of materials.

Furthermore, it should be understood that the present invention will find its implementations in either hardware or computer software depending on the user's specific requirements. Windowed increasing shift-invariant filters represent a plethora of operations including but not limited to processing sampled digital electrical signals such as used in sensors, sound reproduction, servo-mechanical control, audio data compression, ultrasound, and so on. In two dimensions, windowed increasing shift-invariant filters are used to process image data in medical imaging, remote sensing, machine vision and inspection, document processing, synthetic aperture radar, military target recognition, and so on. Examples are object detection, image enhancement, data compression, thresholding, noise-removal, image reconstruction, resolution conversion, segmentation, watermark insertion and detection, character recognition, and various data manipulations to prepare images for printing or display. Samples may also be obtained from higher-dimensional data such as voxels in a digital three dimensional representation of materials. Further, images may have multiple channels, for example, color images may have three or four channels. Remotely sensed images may be "hyperspectral" and have data in tens of spectral bands, for example, a hyperspectral device may have a plurality of sensors, each sensitive to a specific interval of wavelengths such as long infrared, near infrared, visible, ultraviolet, etc. wherein each sensor may generate signals from electromagnetic radiation in its respective band of sensitivity. The windowed increasing shift-invariant filters can also be applied simultaneously on all image bands using the method of the present invention. For example, a filter may have some samples from a long-wave infrared band, some samples from a near infrared band, some from the visible portion of the light spectrum, and some samples from ultraviolet. When taken together, a windowed observation consists of samples separated in space or time as well as wavelength. The method of the present invention readily finds its implementations on sampled signal or image data whether the data are from spatially arranged sensors or from sensors tuned to different wavelengths or a combination thereof.

In summary, a method is presented for implementing a filter on a signal which pre-computes interval membership information to enable filter computation by a small deterministic sequence of table lookups and bit-wise logical operations.

With the above-described detailed description of the preferred embodiment of the present invention and the above-described intended usages and envisioned variations thereto, one skilled in the art of computer architecture and programming and filter design and implementation will readily find their specific implementation in accordance herewith.

This invention may be embodied in other specific forms without departing from its spirit or essential characteristics. The above-described embodiments are to be considered in all respects only as illustrative and not restrictive in scope. The scope of the invention is, therefore, indicated by the appended claims rather than by the above-detailed description. Therefore, all changes which come within the meaning and range of equivalency of the claims are to be considered embraced within their scope.

What is desired to be secured by United States Letters Patent is:

1. A method for implementing a filter on a signal comprising the steps of:
   a) representing an increasing non-linear filter as a plurality of basis elements and the discrete values a sample observation may take by:
      finding, for each output value k of said filter, all possible observations X that result in an output value k or greater; wherein the set of all values that map to an output value k or greater have at least one minimal element at these are known in the art as basis elements;
      arranging said basis elements in a list, 1 through M; and constructing a table in which each basis element number corresponds to the filter output value at that basis element;
   b) corresponding each sample to a component in a vector wherein each basis is a vector;
   c) constructing a table suitable for binary entries;
   d) for each value of said sample:
      comparing said value to the corresponding coordinate of each basis element; and
      inserting into said table a binary entry where '1' denotes that this value is less than the lower value of the coordinate of the basis element and '0' otherwise;
   e) indexing said table to reference the lowest basis element greater than or equal to all elements in the set of all vectors; and
   f) reporting the filter value at said determined basis element.

2. A method for implementing a filter on a signal comprising the steps of:
   a) representing an increasing non-linear filter as a plurality of basis elements and the discrete values a sample observation may take by:
      finding, for each output value k of said filter, all possible observations X that result in an output value k or greater; wherein the set of all values that map to an output value k or greater have at least one minimal element at these are known in the art as basis elements;
      arranging said basis elements in a list, 1 through M; and constructing a first table in which each basis element number corresponds to the filter output value at that basis element;
   b) corresponding each sample to a component in a vector wherein each basis is a vector;
   c) constructing a second table suitable for binary entries;
   d) for each value of said sample:
      comparing said value to each basis element of all vectors; and
      inserting into said table a binary entry where '1' denotes that this value is greater than or equal to the highest value of the coordinate of the each basis element and '0' otherwise; and
   e) indexing said table to reference the largest basis element greater than or equal to all elements in the set of all vectors; and
   f) reporting the filter value at said determined basis element.

* * * * *